United States Patent
Fukui et al.

(10) Patent No.: US 10,453,951 B2
(45) Date of Patent: Oct. 22, 2019

(54) SEMICONDUCTOR DEVICE HAVING A GATE TRENCH AND AN OUTSIDE TRENCH

(71) Applicant: Mitsubishi Electric Corporation, Chiyoda-ku (JP)

(72) Inventors: Yutaka Fukui, Tokyo (JP); Yasuhiro Kagawa, Tokyo (JP); Kensuke Taguchi, Tokyo (JP); Nobuo Fujiwara, Tokyo (JP); Katsutoshi Sugawara, Tokyo (JP); Rina Tanaka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/509,986

(22) PCT Filed: Sep. 9, 2015

(86) PCT No.: PCT/JP2015/075551
§ 371 (c)(1),
(2) Date: Mar. 9, 2017

(87) PCT Pub. No.: WO2016/047438
PCT Pub. Date: Mar. 31, 2016

(65) Prior Publication Data
US 2017/0301788 A1    Oct. 19, 2017

(30) Foreign Application Priority Data
Sep. 26, 2014  (JP) ................ 2014-196514

(51) Int. Cl.
*H01L 29/78*  (2006.01)
*H01L 23/482*  (2006.01)
(Continued)

(52) U.S. Cl.
CPC ....... *H01L 29/7811* (2013.01); *H01L 23/482* (2013.01); *H01L 29/0607* (2013.01);
(Continued)

(58) Field of Classification Search
CPC ................................. H01L 29/7811
See application file for complete search history.

(56) References Cited

U.S. PATENT DOCUMENTS 6,642,600 B2   11/2003  Narazaki et al.
8,610,132 B2   12/2013  Masuda et al.
(Continued)

FOREIGN PATENT DOCUMENTS

JP    2001-511315 A    8/2001
JP    2003-258254 A    9/2003
(Continued)

OTHER PUBLICATIONS

Japanese Office Action dated Oct. 10, 2017 in Patent Application No. 2016-550093 (with English Translation).
(Continued)

*Primary Examiner* — Matthew C Landau
*Assistant Examiner* — Mark Hatzilambrou
(74) *Attorney, Agent, or Firm* — Oblon, McClelland, Maier & Neustadt, L.L.P.

(57) ABSTRACT

A trench-gate semiconductor device including an outside trench, increases reliability of an insulating film at a corner of an open end of the outside trench. The semiconductor device includes: a gate trench reaching an inner part of an n-type drift layer in a cell region; an outside trench outside the cell region; a gate electrode formed inside the gate trench through a gate insulating film; a gate line formed inside the outside trench through an insulating film; and a gate line leading portion formed through the insulating film to cover a corner of an open end of the outside trench closer to the cell region, and electrically connecting the gate electrode to the gate line, and the surface layer of the drift layer in contact with the corner has a second impurity region of p-type that is a part of the well region.

18 Claims, 15 Drawing Sheets

(51) Int. Cl.
- H01L 29/06 (2006.01)
- H01L 29/40 (2006.01)
- H01L 29/423 (2006.01)
- H01L 29/66 (2006.01)
- H01L 29/10 (2006.01)
- H01L 29/16 (2006.01)
- H01L 29/739 (2006.01)

(52) U.S. Cl.
CPC ...... *H01L 29/0623* (2013.01); *H01L 29/0661* (2013.01); *H01L 29/1045* (2013.01); *H01L 29/1608* (2013.01); *H01L 29/407* (2013.01); *H01L 29/4236* (2013.01); *H01L 29/4238* (2013.01); *H01L 29/66068* (2013.01); *H01L 29/78* (2013.01); *H01L 29/66734* (2013.01); *H01L 29/7397* (2013.01); *H01L 29/7813* (2013.01)

(56) References Cited

U.S. PATENT DOCUMENTS

| | | | |
|---|---|---|---|
| 9,184,056 B2 | 11/2015 | Masuda et al. | |
| 2003/0168713 A1* | 9/2003 | Narazaki | H01L 29/66348 257/513 |
| 2013/0285140 A1 | 10/2013 | Kagawa et al. | |
| 2016/0190307 A1* | 6/2016 | Kagawa | H01L 29/66068 257/77 |

FOREIGN PATENT DOCUMENTS

| | | |
|---|---|---|
| JP | 2008-294157 A | 12/2008 |
| JP | 2013-55214 A | 3/2013 |
| JP | 2013-69954 A | 4/2013 |
| WO | 98/35390 A1 | 8/1998 |
| WO | WO 2012/077617 A1 | 6/2012 |
| WO | 2015-015808 A1 | 2/2015 |

OTHER PUBLICATIONS

Information Disclosure Statement issued Nov. 10, 2015 in PCT/JP2015/075551 filed Sep. 9, 2015.

International Preliminary Report on Patentability and Written Opinion dated Apr. 6, 2017 in PCT/JP2015/075551 filed Sep. 9, 2015 (with English translation).

Japanese Office Action dated Dec. 19, 2017 in Japanese Patent Application No. 2016-550093, 6 pages (with unedited computer generated English translation).

* cited by examiner

F I G . 1
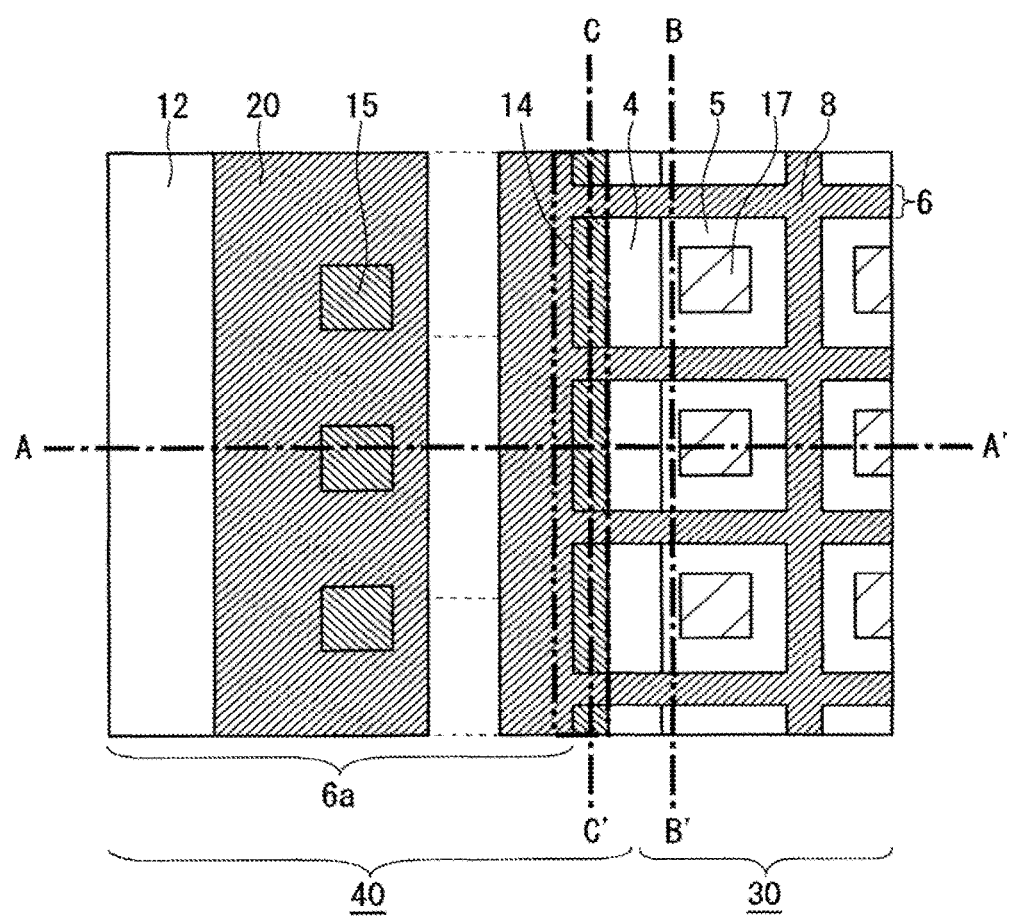

F I G . 3
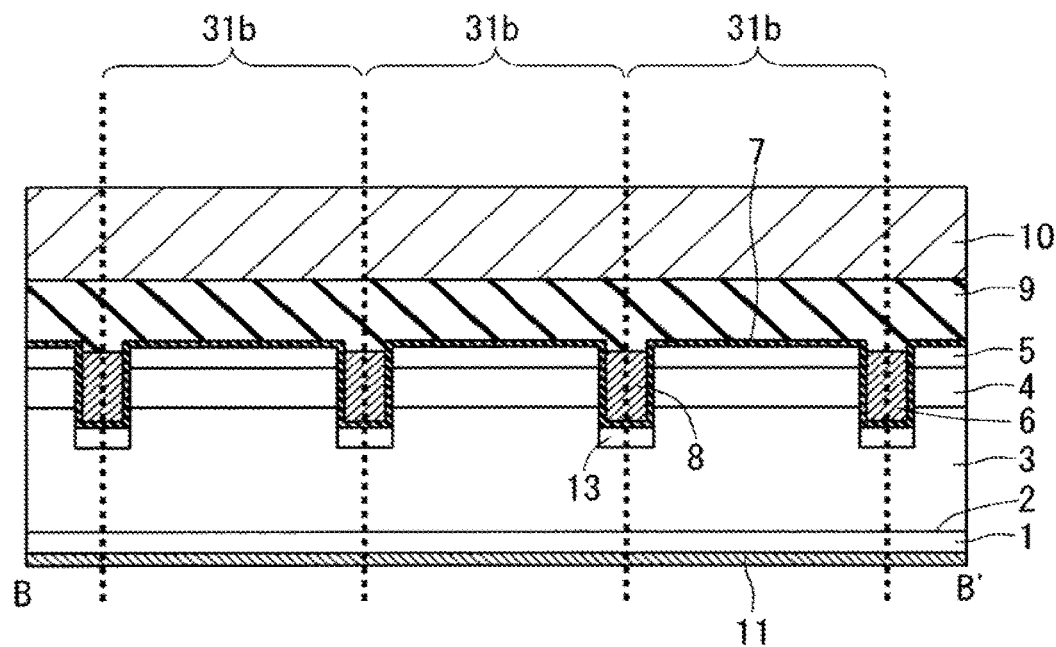
F I G . 4
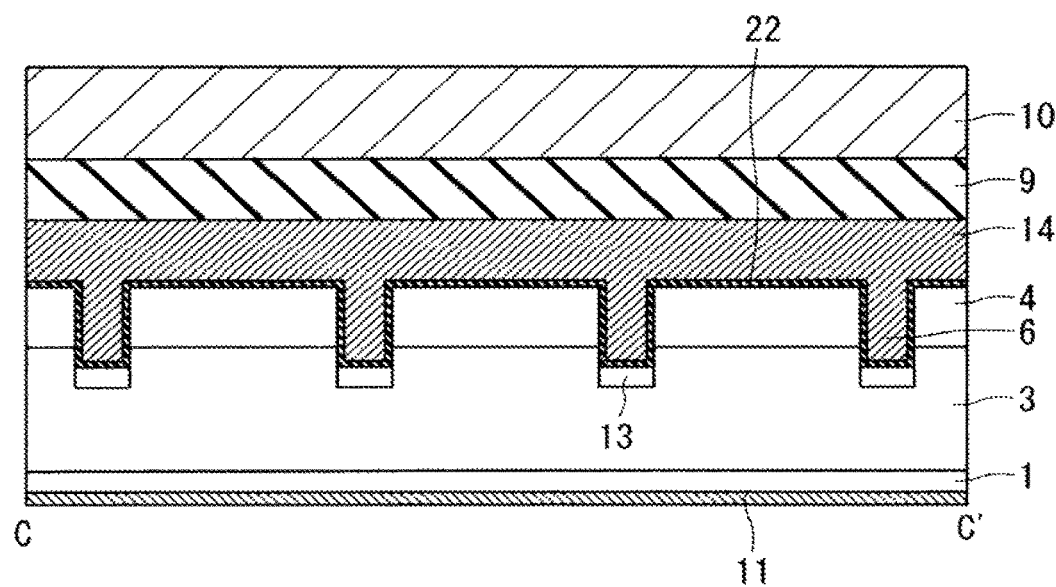

F I G . 1 0
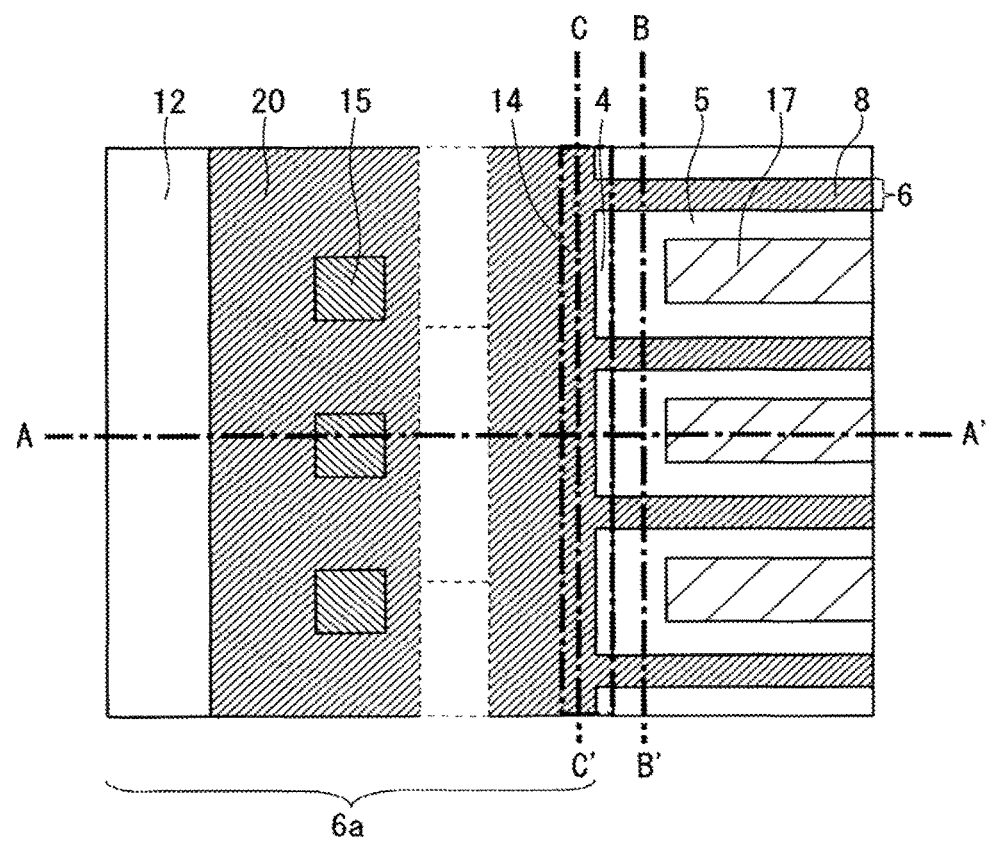

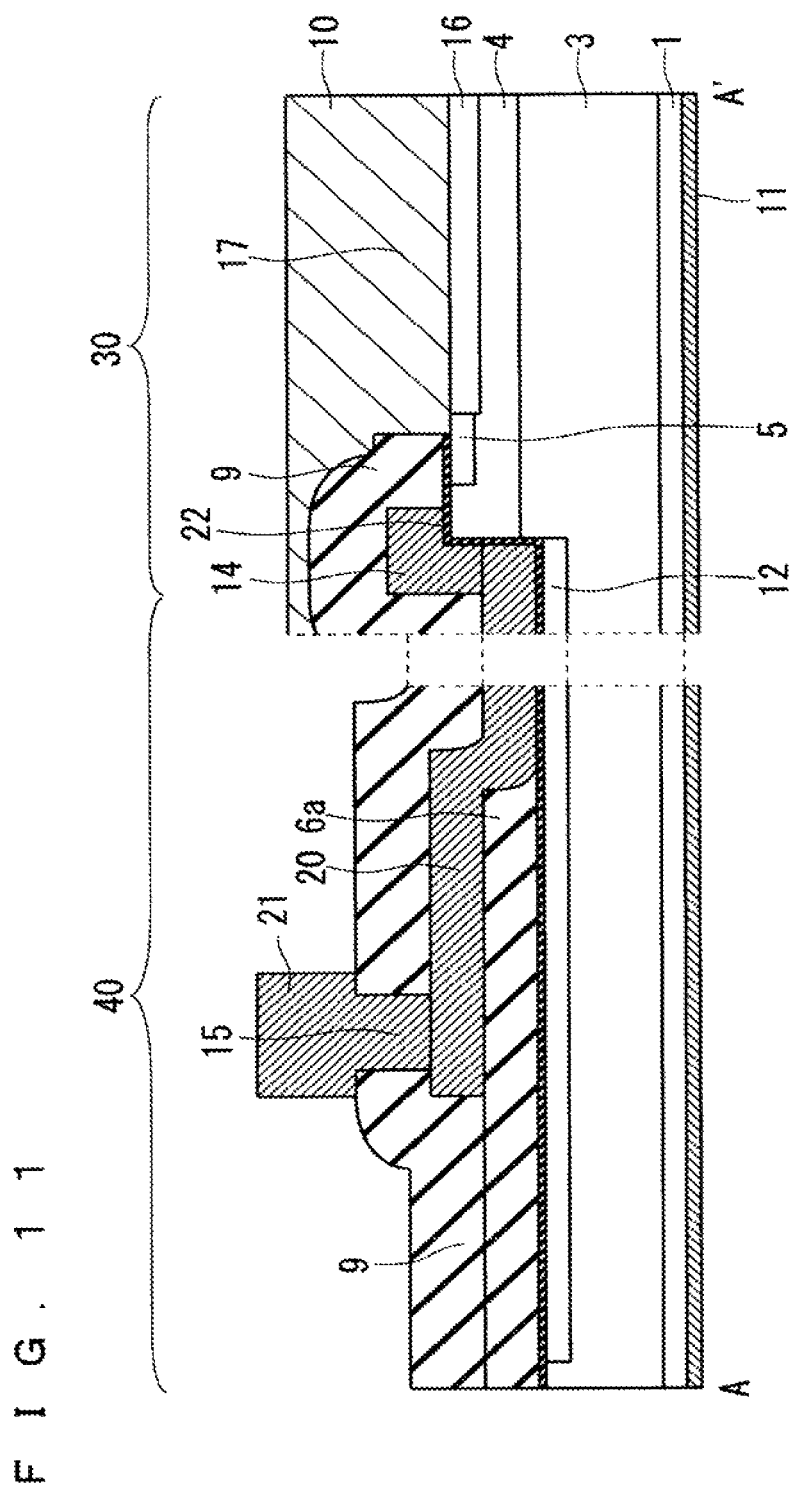

F I G . 1 3
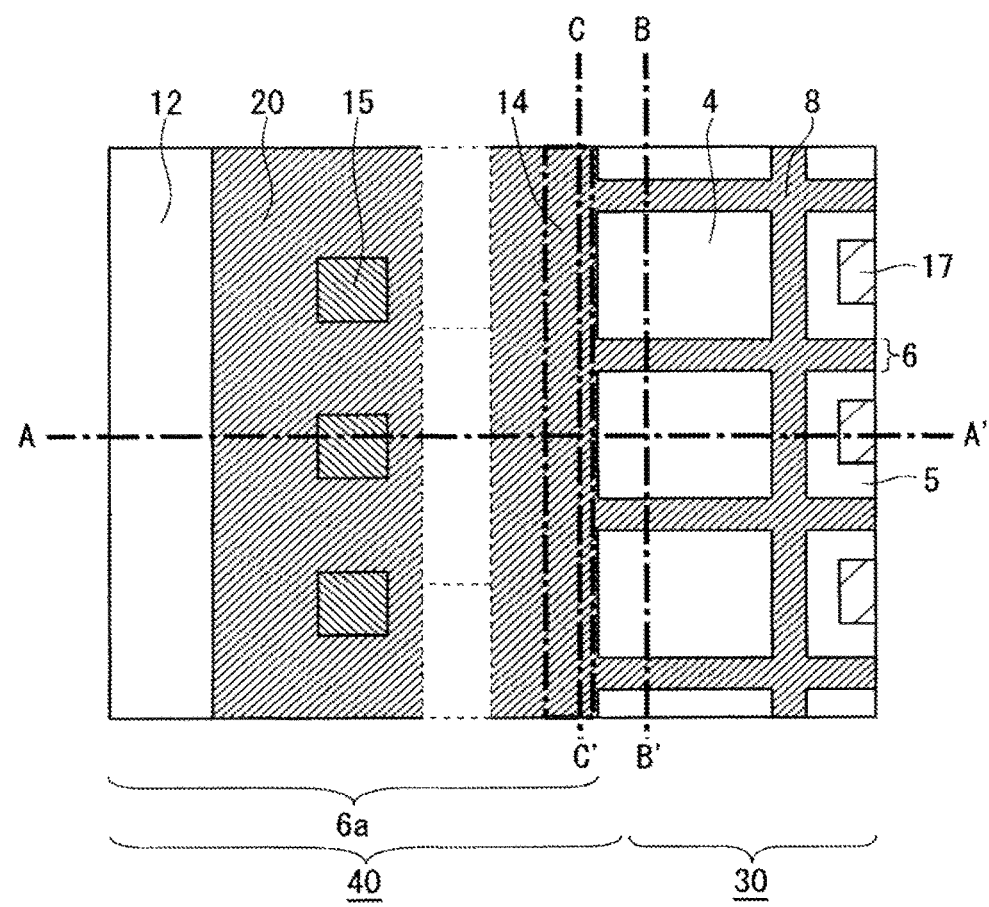

SEMICONDUCTOR DEVICE HAVING A GATE TRENCH AND AN OUTSIDE TRENCH

TECHNICAL FIELD

The invention relates to a semiconductor device, and particularly to a trench-gate semiconductor device.

BACKGROUND ART

Power electronic devices need to switch between ON and OFF of power supply to drive loads of, for example, electric motors. Thus, switching elements made of silicon such as insulated gate bipolar transistors (IGBTs) or metal-oxide-semiconductor field-effect transistors (MOSFETs) are used.

Switching devices intended to be used as power semiconductor devices often adopt the MOSFETs or the IGBTs with vertical structures (vertical MOSFETs or vertical IGBTs). Examples of the vertical MOSFETs include planar MOSFETs and trench (trench-gate) MOSFETs that are selected depending on the gate structure (for example, see Patent Document 1).

In the trench-gate MOSFETs in which gate trenches that are channels are formed in a drift layer of a first conductivity type (n-type) in a cell region, the gate insulating film at the bottom of the gate trenches may break down due to its structure, with application of a high electric field thereto when the MOSFETs are turned OFF. To counter this problem, Patent Document 1 provides, for example, electric field grading regions of a second conductivity type (p-type) at the bottom of the gate trenches (trench-bottom electric field grading regions) to grade the electric field applied to the gate insulating film at the bottom of the gate trenches.

With the structure, extension of a depletion layer from the trench-bottom electric field grading regions to the drift layer enables reduction in the electric field applied to the gate insulating film at the bottom of the gate trenches. The gate trenches inside the cell region further obtain an electric field grading effect from adjacent trench-bottom electric field grading regions at the bottom of the gate trenches. However, gate trenches at the outermost circumference of the cell region cannot obtain the electric field grading effect from outside the cell region because of no trench-bottom electric field grading region formed outside the cell region. Thus, the bottom of the gate trenches at the outermost circumference of the cell region may break because the electric field is concentrated on the region more than the bottom of the gate trenches inside the cell region.

To counter this problem, for example, etching, in an termination region outside a cell region, a drift layer as deep as gate trenches in the cell region to form an outside trench that pierces through a source region and a well region that are stretched from the cell region and thereby form an electric field grading region of a second conductivity type (termination electric field grading region) at the bottom of the outside trench enables grading the concentration of an electric field on gate trenches at the outermost circumference of the cell region and improvement in the withstand performance.

PRIOR-ART DOCUMENTS

Patent Documents

Patent Document 1: Japanese Patent Application-Laid-Open No. 2001-511315

SUMMARY OF INVENTION

Problems to be Solved by the Invention

In the outside trench, a gate line for connecting gate electrodes in the cell region to a gate pad is formed through an insulating film. Here, it is preferred to form a gate line leading portion to cover a corner of an open end of the outside trench that is closer to the cell region in order to prevent disconnection of the gate line. An electric field tends to be concentrated on the open end of the outside trench due to its shape at the corner. Thus, there has been a problem with decrease in the reliability of the insulating film in the cell region because the electric field is concentrated on the open end of the outside trench that is covered with the gate line leading portion when a voltage is applied between a source electrode and the gate electrodes.

The present invention has been conceived to solve the problem, and has an object of increasing, in a trench-gate semiconductor device including an outside trench, the reliability of an insulating film at a corner of an open end of the outside trench.

Means to Solve the Problems

A semiconductor device according to the present invention includes: an n-type drift layer; a p-type well region formed in a surface layer of the drift layer in a cell region; an n-type first impurity region partially fowled in a surface layer of the well region; a gate trench that pierces through the well region from a surface of the first impurity region to reach an inner pan of the drift layer; an outside trench formed outside the cell region and in the drift layer; a gate electrode formed inside the gate trench through a gate insulating film; a gate line formed inside the outside trench through an insulating film; and a gate line leading portion formed through the insulating film to cover a corner of an open end of the outside trench that is closer to the cell region, the gate line leading portion electrically connecting the gate electrode to the gate line, wherein the surface layer of the drift layer that is in contact with the corner has a second impurity region of p-type, and the second impurity region is a part of the well region.

Effects of the Invention

The semiconductor device according to the present invention includes a gate line leading portion formed through the insulating film to cover a corner of an open end of the outside trench that is closer to the cell region, the gate line leading portion electrically connecting the gate electrode to the gate line, and the surface layer of the drift layer that is in contact with the corner has a second impurity region of p-type. Thus, since the resistance of the second impurity region can be increased, an electric field to be applied to the insulating film at the corner that is sandwiched between the gate line leading portion and the second impurity region can be reduced and the reliability of the insulating film can be increased.

BRIEF DESCRIPTION OF DRAWINGS

FIG. 1 is a plan view schematically illustrating a structure of a semiconductor device according to Embodiment 1.

FIG. 3 is a cross-sectional view taken along B-B' of FIG. 1.

FIG. 4 is a cross-sectional view taken along C-C' of FIG. 1.

FIG. 10 is a plan view schematically illustrating a structure of a semiconductor device according to a modification of Embodiment 1.

FIG. 11 is a cross-sectional view taken along A-A' of FIG. 10.

FIG. 13 is a plan view schematically illustrating a structure of a semiconductor device according to Embodiment 3.

DESCRIPTION OF EMBODIMENTS

Figure 2:
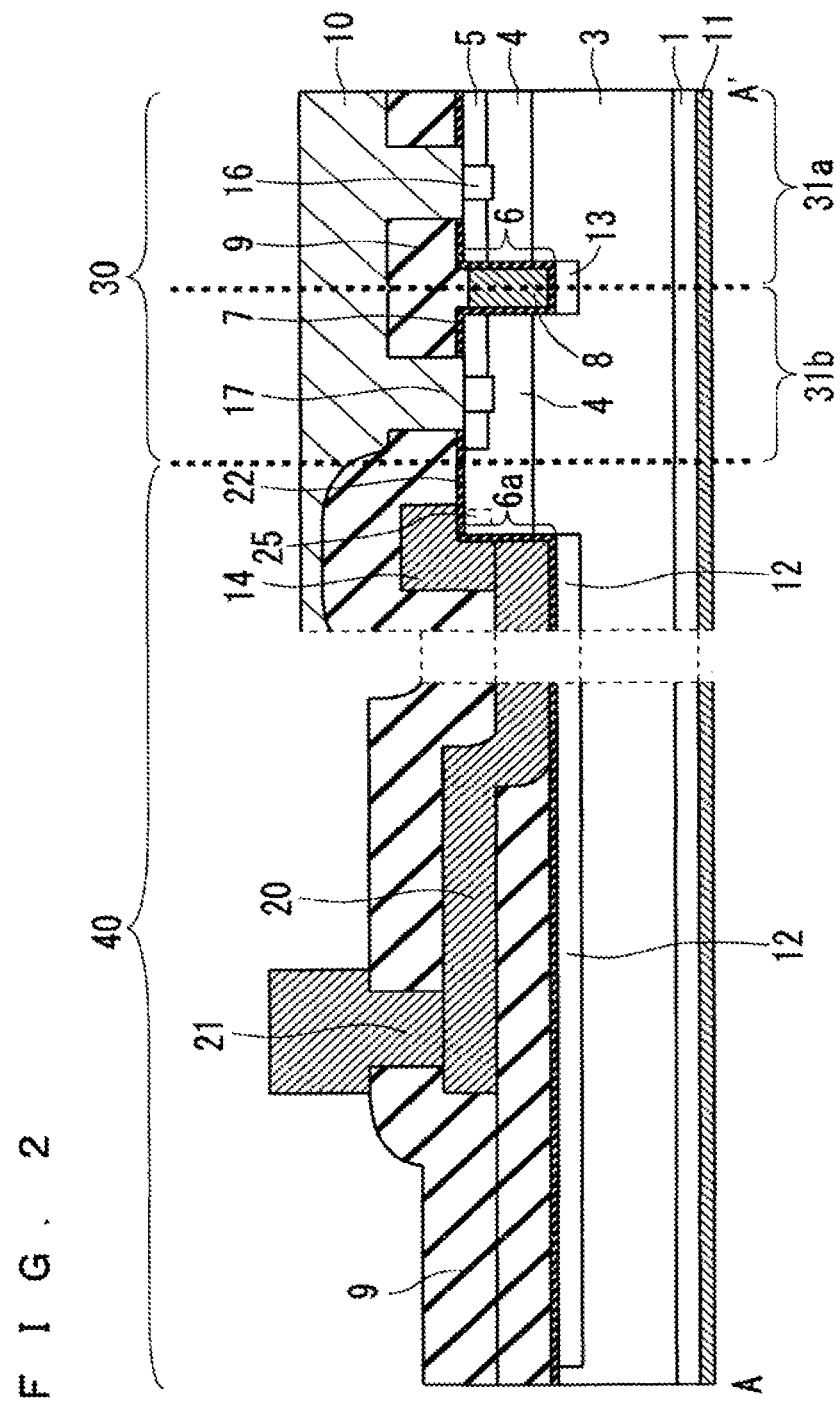
FIG. 2 is a cross-sectional view taken along A-A' of FIG. 1.

Embodiments will be hereinafter described with reference to the accompanying drawings. Since the drawings are schematically illustrated, the mutual relationships in size and position between images in the different drawings are not necessarily accurate but may be appropriately changed. Furthermore, the same reference numerals are assigned to the same constituent elements, and their names and functions are the same. Thus, the detailed description thereof may be omitted.

Although the description below sometimes uses the terms representing particular positions and directions including "above", "below", "side", "bottom", "surface", and "back", these are used for convenience to facilitate understanding of the details of Embodiments, and do not relate to the directions for actual use.

Embodiment 1

FIG. 1 is a planar bird's eye view schematically illustrating a structure of a vertical trench-gate silicon carbide MOSFET that is an example of a semiconductor device according to Embodiment 1. Furthermore, FIG. 2 is a cross-sectional view taken along A-A' of FIG. 1, FIG. 3 is a cross-sectional view taken along B-B' of FIG. 1, and FIG. 4 is a cross-sectional view taken along C-C' of FIG. 1. FIG. 1 omits a part of the structure to facilitate understanding of the arrangement of a gate line leading portion 14. FIG. 3 illustrates a cross-section of a cyclical structure of circumferential cells 31b including source regions 5 in a cross-section of a cell region 30. FIG. 4 illustrates a cross-section including the gate line leading portion 14.

The semiconductor device according to Embodiment 1 in FIG. 1 includes the cell region 30 that is an array of MOSFET cells (active unit cells) each formed with a gate trench 6 around one source region 5, and an termination region 40 formed outside the cell region 30. The gate trenches 6 are formed to divide the cell region 30 into the MOSFET cells, and a gate electrode 8 is embedded in each of the gate trenches 6. According to Embodiment 1, the MOSFET cells arranged at the outermost circumference of the cell region 30 are defined as outermost circumferential cells 31b, and the other MOSFET cells are defined as the unit cells 31a. In other words, the outermost circumferential cells 31b are between the unit cells 31a and the termination region 40.

FIG. 1 illustrates the cell region 30 corresponding to the tight-hand side thereof including the source regions 5, and the to termination region 40 corresponding to the left-hand side thereof. In other words, the outside portion of the cell region 30 in FIG. 1 is the region to the left of the outermost circumferential cells 31b.

In the termination region 40, an outside trench 6a is formed to pierce through a well region 4, and includes a gate line 20. The gate line leading portion 14 electrically connects the gate line 20 to gate electrodes 8. In FIG. 1, the gate line leading portion 14 is a region enclosed by a dashed line. The gate line 20 is connected to a gate pad 21 (illustrated in FIG. 2) through gate contact holes 15 in the termination region 40.

FIG. 2 is a cross-sectional view of the semiconductor device according to Embodiment 1. The semiconductor device includes a drift layer 3 and a silicon carbide semiconductor substrate 1 that is a substrate, and in the cell region 30, the well region 4, the source regions 5, well contact regions 16, the gate trenches 6, a gate insulating film the gate electrodes 8, an interlayer insulation film 9, a source electrode 10, a drain electrode 11, and trench-bottom electric field grading regions 13. Furthermore, the semiconductor device includes, in the termination region 40, the outside trench 6a, a termination electric field grading region 12, the gate line leading portion 14, an insulating film 22, the interlayer insulation film 9, the gate line 20, and the gate pad 21. Here, the source regions 5 are first impurity regions.

As illustrated in FIG. 2 in the silicon carbide semiconductor device according to Embodiment 1, the n-type drill layer 3 that is made of silicon carbide is formed on the surface of the silicon carbide semiconductor substrate 1 of a 4H polytype. The surface of the drift layer 3 is a (0001) plane having an off-angle θ that is inclined toward a [11-20] axial direction. The off-angle θ may be, fir example, lower than or equal to 10°. The p-type well region 4 is formed in a surface layer of the drift layer 3 in the cell region 30 including the array of the MOSFET cells. The n-type source regions 5 and the p-type well contact regions 16 are selectively (partially) firmed in the surface layer of the well region 4. The well contact regions 16 are surrounded by the source regions 5 in the plan view.

The gate trenches 6 are formed to pierce through the well region 4 from the surface of the source regions 5 to reach an inner part of the drift layer 3. The gate electrodes 8 are embedded in the gate trenches 6 through the gate insulating film 7. The upper surface of the gate electrodes 8 is deeper than the surface of the source regions 5. In other words, the upper surface of the gate electrodes 8 is deeper than the open ends of the gate trenches 6.

in the cell region 30, the p-type trench-bottom electric field grading regions 13 (first electric field grading regions) are formed under the bottom of the gate trenches 6. These trench-bottom electric, field grading regions 13 for grading the electric field applied to the bottom of the gate trenches 6 are not necessarily but preferably in contact with the bottom of the gate trenches 6. Furthermore, although the trench-bottom electric field grading regions 13 are arranged at the bottom of the gate trenches 6, they may be arranged below the well region 4 and between the adjacent gate trenches 6. Here, the trench-bottom electric field grading regions 13 may be in contact with or spaced apart from the well region 4. In other words, arranging the p-type trench-bottom electric field grading regions 13 deeper than the well region 4 and preferably deeper than the bottom of the gate trenches 6 can grade the electric field applied to the bottom of the gate trenches 6.

The outside trench 6a is formed in the termination region 40 outside the cell region 30. The outside portion of the cell region 30 in FIG. 2 is to the left of the drawing. The well region 4 is formed to be stretched from the outermost circumferential cell 31b that is the MOSFET cell at the outermost circumference of the cell region 30 to the termination region 40. The outside trench 6a is formed to pierce through the well region 4 to reach the inner pan of the drift layer 3. The gate line 20 is formed inside the outside trench 6a through the insulating film 22. Furthermore, the gate line leading portion 14 is formed, through the insulating film 22, at the corner of the open end of the outside trench 6a that is closer to the cell region 30 In other words, the well region 4 and the gate line leading portion 14 face to each other through the insulating film 22 at the corner of the open end of the outside trench 6a that is closer to the cell region 30.

Thus, in the surface layer of the drift layer 3, a second impurity region 25 formed at the corner of the open end of the outside trench 6a that is closer to the cell region 30 is the p-type well region 4. In FIG. 2. the second impurity region 25 is a region enclosed by a dashed line. Here, the second impurity region 25 is, for example, a region as deep as the source regions 5 in the surface layer of the drift layer 3.

According to Embodiment 1, the conductivity type of the drift layer 3 at the corner of the open end of the outside trench 6a, that is, the second impurity region 25 is set to p-type by not forming the source regions 5 at which, in the termination region 40, the outside trench 6a pierces through the well region 4.

In the termination region 40, the p-type termination electric field grading region 12 (second electric field grading region) is formed under the bottom of the outside trench 6a etched as deep as the gate trenches 6.

The interlayer insulation film 9 is formed to cover the surface of the drift layer 3 above which the gate electrodes 8 and the gate line 20 are formed, and the source electrode 10 is formed in contact with the source regions 5 and the well contact regions 16 through source contact holes 17 obtained by partially removing the interlayer insulation film 9. Furthermore, the gate pad 21 is formed, in the termination region 40, to be electrically connected to the gate line 20 through the gate contact holes 15 obtained by partially removing the interlayer insulation film 9. Furthermore, the drain electrode 11 is formed in contact with the back side of the silicon carbide semiconductor substrate 1 that is opposite to the surface thereof.

The gate electrodes 8 are interconnected from the cell region 30 to the gate line 20 in the termination region 40 through the gate line leading portion 14. In other words, the gate line leading portion 14 electrically connects the gate electrodes 8 to the gate line 20. Furthermore, the gate line 20 is connected to the gate pad 21 through the gate contact holes 15.

FIG. 3 is a cross-sectional view of the outermost circumferential cells 31b taken along B-B' of FIG. 1. In the outermost circumferential cells 31b of the cell region 30, the top surface of the gate electrodes 8 is formed deeper than the open ends of the gate trenches 6. Furthermore, since the gate trenches 6 pierce through the source regions 5, the n-type source regions 5 are formed at the corners of the open ends of the gate trenches 6 in the drift layer 3. However, the gate insulating film 7 is covered with the interlayer insulation film 9, and the gate electrode 8 is not formed at the corners of the open ends of the gate trenches 6. In other words, the n-type source regions 5 do not face the gate electrodes 8 through the gate insulating film 7 at the corners of the gate trenches 6 in the cell region 30.

FIG. 4 is a cross-sectional view taken along C-C' of FIG. 1 and illustrates the gate line leading portion 14 formed at the corner of the open end of the outside trench 6a in the termination region 40. In FIG. 4, the gate electrodes 8 in the gate trenches 6 are connected to the gate line leading portion 14. As illustrated in FIG. 4, the gate line leading portion 14 is formed to cover the surface of the drift layer 3, and is connected to the gate electrodes 8 in the gate trenches 6 stretched up to the termination region 40.

Although FIGS. 1 to 4 illustrate that the cross-section of all the outermost circumferential cells 31b to be connected to the gate line leading structure has a structure illustrated by the cross-section taken along A-A' in FIG. 2, the cross-section is not limited to such but may be a part of the whole. In other words, a part of the cross-section of the termination region 40 that is in contact with the outermost circumferential cells 31b of the cell region 30 may have the structure illustrated in FIG. 2.

For example, when a chip in a top view is rectangular, the cross-section solely at the apex may have the structure illustrated in FIG. 2. This is because the electric field applied to the insulating film 22 to be described later tends to be concentrated particularly on the apex. If the whole cross-section of the termination region 40 that is in contact with the outermost circumferential cells 31b of the cell region 30 has the structure illustrated in FIG. 2, obviously, the advantages of Embodiments to be described later will be greater.

Next, a method for manufacturing a trench-gate MOSFET as the semiconductor device according to Embodiment 1 will be described with reference to FIGS. 5 to 9.

Figure 5:
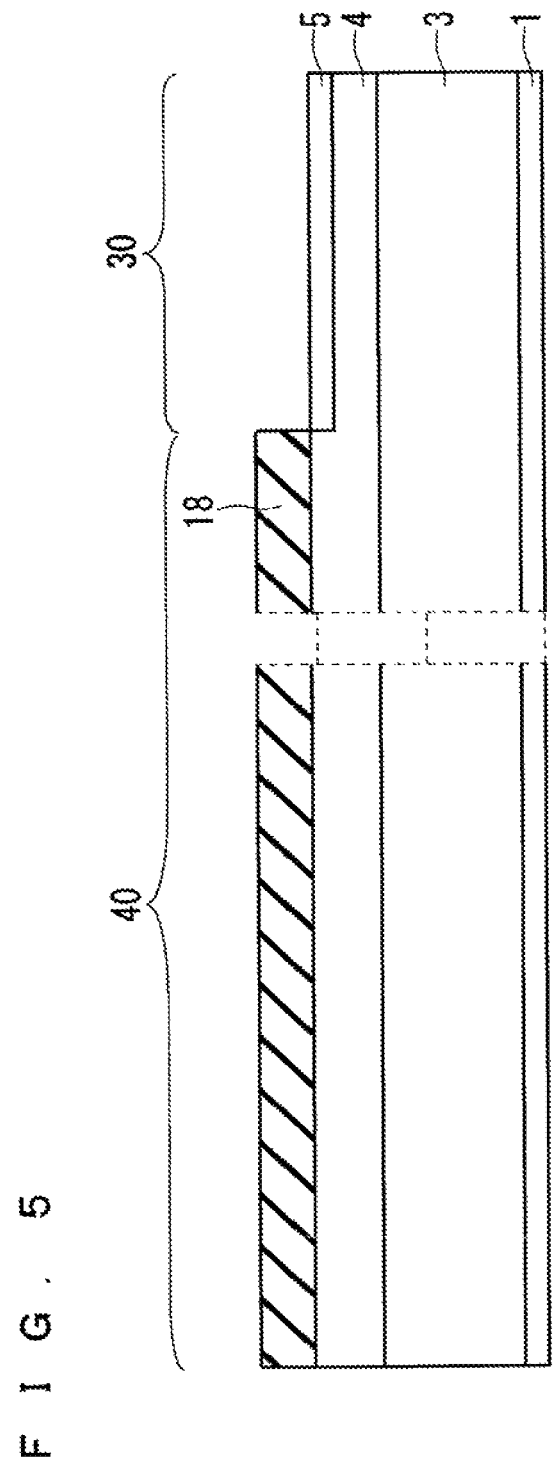
FIG. 5 is a cross-sectional view illustrating a method for manufacturing the semiconductor device according to Embodiment 1.

FIG. 5 is a cross-sectional view illustrating processes up to forming the source region 5 of the trench-gate MOSFET according to Embodiment 1. First, the drift layer 3 made of silicon carbide that is of relatively high resistance n-type ($n^-$ type) is epitaxially grown on the surface of the n-type silicon carbide semiconductor substrate 1 of the 4H polytype.

Next, an alignment mark that is not illustrated is formed by reactive ion etching (RIE). Then, forming the p-type well region 4 and the source region 5 of low resistance ($n^+$ type) in the surface layer of the drift layer 3 by implanting ions with respect to this alignment mark yields a structure illustrated in FIG. 5. A resist mask 18 is used as an implantation mask for the source region 5.

Here, the source region 5 is formed to have an n-type impurity concentration ranging from $5 \times 10^{18}$ [$cm^{-3}$] to $5 \times 10^{20}$ [$cm^{-3}$], and the well region 4 is formed to have a p-type impurity concentration ranging from $1 \times 10^{16}$ [$cm^{-3}$] to $3 \times 10^{19}$ [$cm^{-3}$]. The n-type impurity concentration of the source region 5 is set higher than the p-type impurity concentration of the well region 4 to form the source region 5 in the surface layer of the well region 4.

The concentration of the well region 4 in a depth direction may be either constant or non-constant. The well region 4 may have, for example, a decreasing distribution of the surface concentration or a distribution that peaks in a depth direction.

Figure 6:
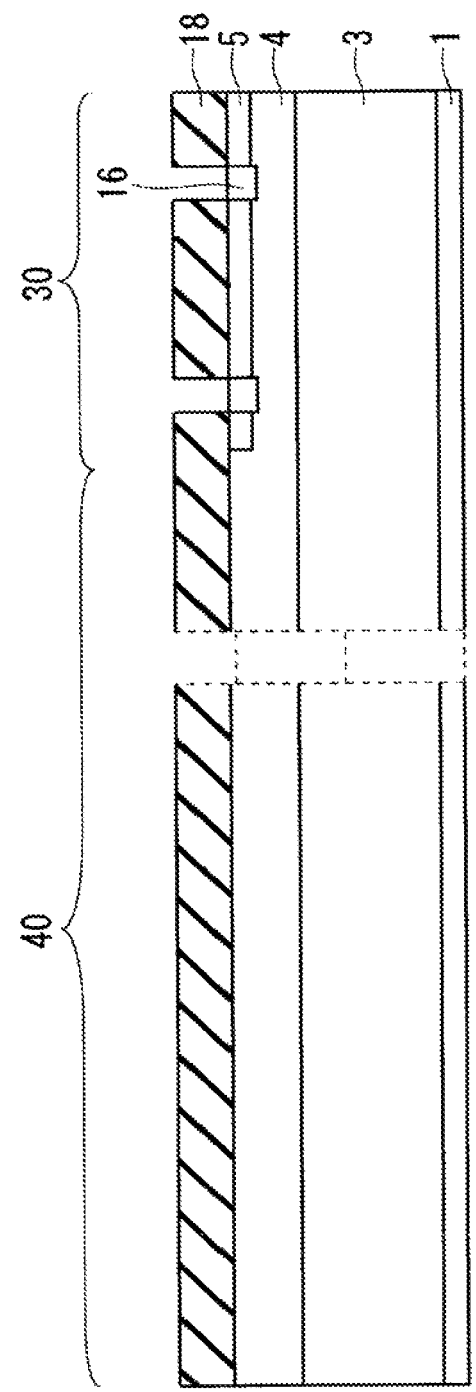
FIG. 6 is a cross-sectional view illustrating a method for manufacturing the semiconductor device according to Embodiment 1.

FIG. 6 is a cross-sectional view illustrating processes up to forming the well contact regions 16 of the trench-gate MOSFET according to Embodiment 1. Forming the p-type well contact regions 16 by implanting ions yields a structure illustrated in FIG. 6. The well contact regions 16 may have a p-type impurity concentration ranging from $1\times10^{19}$ [cm$^{-3}$] to $1\times10^{22}$ [cm$^{-3}$].

Figure 7:
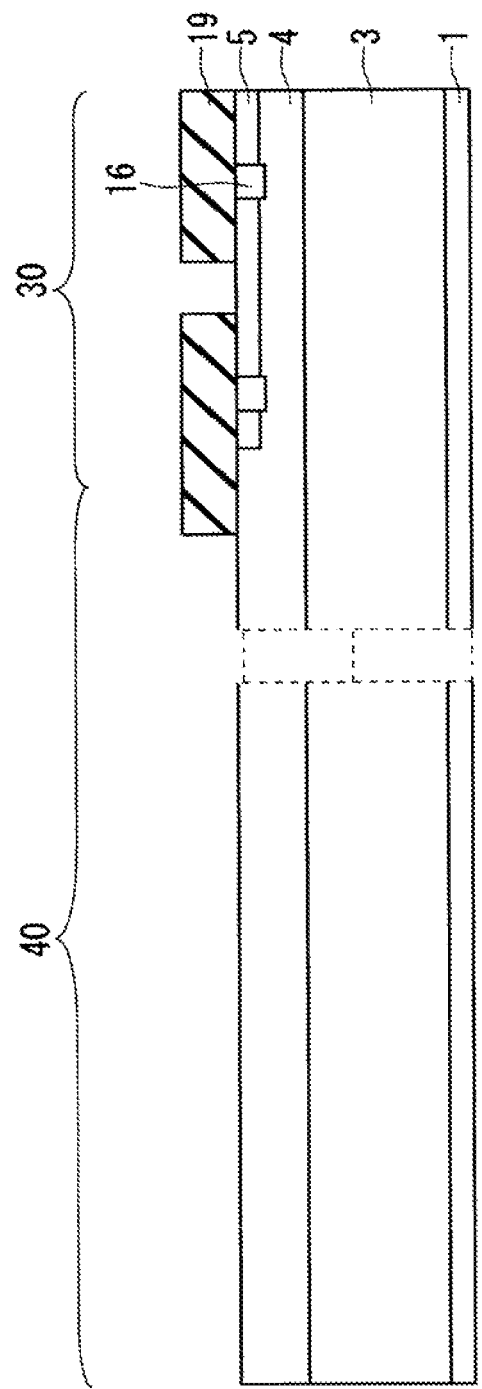
FIG. 7 is a cross-sectional view illustrating a method for manufacturing the semiconductor device according to Embodiment 1.

FIG. 7 is a cross-sectional view illustrating processes up to forming the gate trench 6 and the outside trench 6a of the trench-gate MOSFET according to Embodiment 1. Patterning an etching mask 19 for forming the gate trench 6 and the outside trench 6a using a resist mask yields a structure illustrated in FIG. 7.

Figure 8:
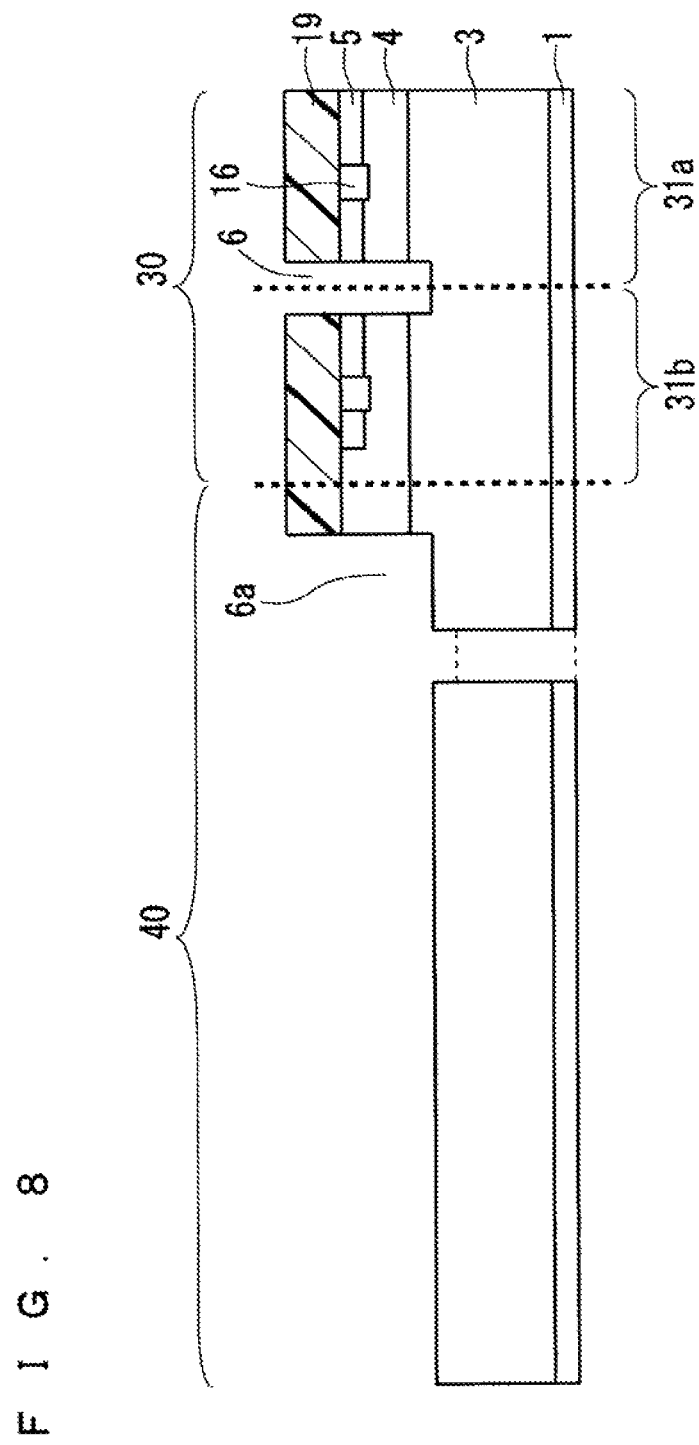
FIG. 8 is a cross-sectional view illustrating a method for manufacturing the semiconductor device according to Embodiment 1.

FIG. 8 is a cross-sectional view illustrating processes up to forming the gate trench 6 and the outside trench 6a of the trench-gate MOSFET according to Embodiment 1. Forming the gate trench 6 and the outside trench 6a to be deeper than the well region 4 to reach the drift layer 3 by RIE from the structure in FIG. 7 yields a structure illustrated in FIG. 8.

Next, the p-type trench-bottom electric field grading region 13 is formed at the bottom of the gate trench 6 and successively, the p-type termination electric field grading region 12 is formed at the bottom of the outside trench 6a, while maintaining the etching mask 19 as the implantation mask. The trench-bottom electric field grading region 13 and the termination electric field grading region 12 may be formed simultaneously or separately. Furthermore, the termination electric field grading region 12 may have a horizontal concentration distribution. In other words, the termination electric field grading region 12 may have, for example, a distribution of a stepwise decrease in concentration from its end closer to the cell region 30 toward the outside thereof.

Next, annealing is performed for a period from 0.5 to 60 minutes at a temperature ranging from 1500° C. to 2200° C. to activate the implanted ions.

Furthermore, the gate insulating film 7 is formed inside and around the gate trenches 6 and the insulating film 22 is formed inside and around the outside trench 6a by, for example, thermal oxidation or chemical vapor deposition (CVD). The gate insulating film 7 and the insulating film 22 may be formed simultaneously or separately. Thus, the gate insulating film 7 and the insulating film 22 may have the same thickness or different thicknesses.

Figure 9:
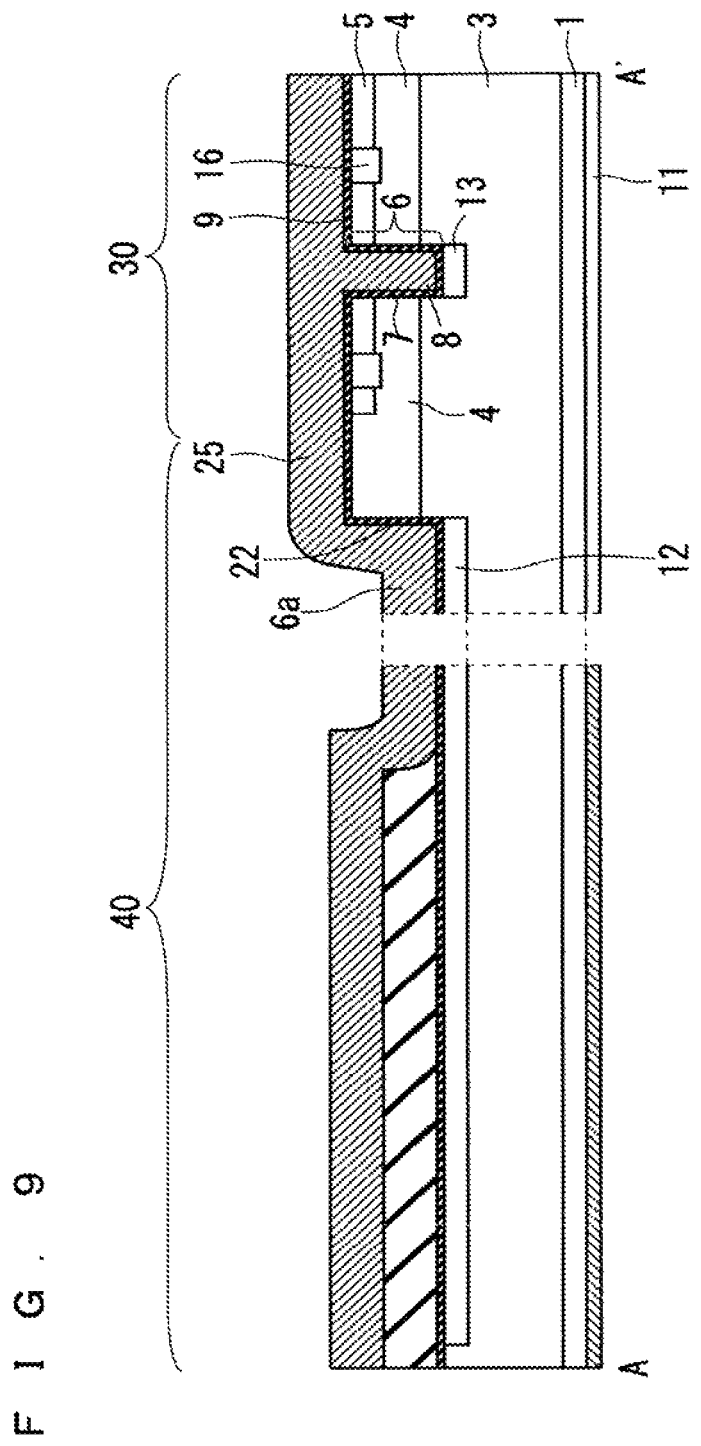
FIG. 9 is a cross-sectional view illustrating a method for manufacturing the semiconductor device according to Embodiment 1.

FIG. 9 is a cross-sectional view illustrating processes up to forming polysilicon 25 that is a material of the gate electrodes 8 included in the trench-gate MOSFET according to Embodiment 1. The polysilicon 25 on which impurities have been doped is formed, by CVD and etc, on the entire drift layer 3 formed with the gate insulating film 7 and the insulating film 22. Here, the polysilicon 25 is fully embedded in the gate trenches 6. Furthermore, the polysilicon 25 is formed inside the outside trench 6a.

Here, when formed by CVD, the polysilicon 25 is CVD-grown inside the gate trenches 6, not only in a depth direction from the bottom of the gate trenches 6 but also in a horizontal direction from the side surface of the gate trenches 6. Thus, the polysilicon 25 is relatively easily embedded in the gate trenches 6.

Since the outside trench 6a is larger in horizontal width than the gate trench 6, the growth of the polysilicon 25 from the side surface of the outside trench 6a hardly affects a portion at a certain distance from the side surface thereof. For example, the polysilicon 25 grown by CVD from the side surface of the outside trench 6a hardly affects an inner position of the outside trench 6a that is horizontally spaced apart from the side surface thereof by a depth of the outside trench 6a or more.

Thus, the polysilicon 25 is formed above the bottom of the outside trench 6a that is spaced apart from the side surface thereof to some extent to be as thick as the polysilicon 25 grown on the surface of the drift layer 3 in the cell region 30.

As illustrated in FIG. 9 in the cell region 30, the polysilicon 25 with slightly thinner portions is formed by the CVD growth from the side surface of the gate trench 6 at an upper portion of the open end of the gate trench 6 to be thicker to some extent than that above the surface of the drift layer 3 without the gate trench 6 embedded. In other words, the polysilicon 25 is formed above the bottom of the gate trench 6 to be thicker than or equal to the depth of the gate trench 6.

Next, the polysilicon 25 above the surface of the drift layer 3 in the cell region 30 is etched back. Here, forming the gate electrode 8 in the gate trench 6 and the gate line 20 in the outside trench 6a require the polysilicon 25 in these regions to be maintained. Since the polysilicon 25 thicker than that above the surface of the drift layer 3 is formed on the bottom of the gate trench 6, the gate electrode 8 can be formed without a mask for etching back.

However, since the polysilicon 25 as thick as that above the surface of the drift layer 3 in the cell region 30 is merely formed on the bottom of the outside trench 6a, a mask needs to be formed in the etching back to form the gate line 20.

Here, since the gate line 20 needs to be electrically connected to the gate electrodes 8, it is necessary to prevent disconnection between the gate electrodes 8 and the gate line 20 at the side surface of the outside trench 6a that is closer to the cell region 30. Thus, it is preferred to form a mask for etching back to cover the bottom of the outside trench 6a from the side surface of the outside trench 6a that is closer to the cell region 30.

However, since difficulties lie in process of forming the mask for etching back by being accurately patterned on the side surface of the outside trench 6a that is closer to the cell region 30, a certain process margin needs to be provided. Thus, it is preferred to form the mask for etching back to extend off the cell region 30 from the side surface of the outside trench 6a that is closer to the cell region 30. In other words, the mask for etching back is formed to cover the outside trench 6a from an upper portion of the bottom surface thereof to the corner of the open end thereof that is closer to the cell region 30 to reliably prevent disconnection between the gate electrodes 8 and the gate line 20.

The extension amount from the side surface of the outside trench 6a to the cell region 30 may range, for example, from 0.1 μm to 3 μm. The excessive reduction in extension amount may cause disconnection in gate due to limitations on the process accuracy. Furthermore, the excessive increase in extension amount requires widening of a distance between the outermost circumferential cell 31b and the outside trench 6a, which enlarges the area of the chip owing to increase in area of the termination region 40, thus leading to increase in cost for the chip.

As such, after the mask for etching back across a part of the cell region 30 from a part of the termination region 40 is patterned, the polysilicon 25 is etched back to the surface of the gate insulating film 7 above the surface of the drift layer 3. Here, although the polysilicon 25 formed above the surface of the drift layer 3 in the cell region 30 is removed by etching, the polysilicon 25 embedded in the gate trenches 6 remains because of its thickness, and then the gate electrodes 8 are formed.

However, since the polysilicon 25 formed above the open ends of the gate trenches 6 is slightly thinner at the gate trenches 6 than the polysilicon 25 formed above the surface of the drift layer 3, when the entire polysilicon 25 on the surface of the drift layer 3 is etched, the surface of the gate electrodes 8 inside the trenches 6 is formed deeper than the open ends of the trenches 6.

The surface of the gate electrodes 8 inside the trenches 6 may be formed deeper than the open ends of the gate trenches 6 by over-etching the polysilicon 25 above the surface of the drift layer 3. Here, it is preferred to define an etching ratio between the polysilicon 25 and the gate insulating film 7 under etching conditions when the polysilicon 25 is etched.

In the termination region 40, the polysilicon 25 inside the outside trench 6a covered with the mask for etching back remains, and the gate line 20 is formed. The gate line 20 may be thrilled from the side surface of the outside trench 6a closer to the cell region 30 to the gate contact holes 15.

Furthermore, with the mask for etching back, the polysilicon 25 remains to cover the corner of the open end of the outside trench 6a that is closer to the cell region 30, and the gate line leading portion 14 is formed.

The polysilicon 25 is etched so that the gate electrodes 8, the gate line leading portion 14, and the gate line 20 are electrically connected.

Next, after the mask for etching back is removed and the interlayer insulation film 9 is formed to cover the termination region 40 and the cell region 30, the source contact holes 17 are formed by, for example, dry etching, and the gate contact holes 15 are formed by, for example, dry etching or wet etching.

Then, the source electrode 10 is formed at least on the p-type well contact regions 16 and the n-type source regions 5. Furthermore, the gate pad 21 or a line for connection to the gate pad 21 (not illustrated) is formed from the inner portion to the upper portion of the gate contact holes 15.

Lastly, forming the drain electrode 11 on the back side of the silicon carbide semiconductor substrate 1 enables a trench-gate MOSFET to be manufactured as a semiconductor device having the cell structure illustrated in FIG. 1.

Next, advantages of the trench-gate MOSFET as the semiconductor device according to Embodiment 1 will be described.

First, advantages of the termination electric field grading region 12 etched as deep as the gate trenches 6 in the cell region 30 and formed at the bottom of the outside trench 6a in the termination region 40 will be described. The termination electric field grading region 12 is normally known as a region having p-type impurities having an electric field grading effect, such as a junction termination extension (JTE) region or a field limiting ring (FLR) region, and as a region formed around the cell region 30 in which MOSFET cells are arranged to prevent a semiconductor device from breaking due to the concentration of an electric field at the outermost circumference of the cell region 30.

In a planar semiconductor device, the termination electric field grading region 12 such as a JTE region or an FLR region is formed in the surface layer of the drift layer 3 in which the outside trench 6a is not formed. However, in a trench-gate semiconductor device, when the termination electric field grading region 12 is formed in the surface layer of the drift layer 3, the concentration of an electric field at the bottom of the gate trenches 6 in the outermost circumferential cells 31b of the cell region 30 cannot sufficiently be graded during the OFF state. In other words, an electric field is concentrated on the p-n junctions between the drift layer 3 and the trench-bottom electric field grading regions 13 formed at the bottom of the gate trenches 6 in the outermost circumferential cells 31b, and an avalanche breakdown may occur at a drain voltage lower than an assumed voltage. The drain voltage lower than the assumed voltage is a voltage lower than a withstand voltage defined by the concentration and the thickness of the drift layer 3.

When the termination electric field grading region 12 is formed at the bottom of the outside trench 6a etched as deep as the gate trenches 6 in the cell region 30, the electric field locally concentrated on the trench-bottom electric field grading regions 13 at the outermost circumference of the cell region 30 is graded, and the sufficient avalanche resistance is ensured. Here, even when the gate trenches 6 and the outside trench 6a are not identical in depth, the termination electric field grading region 12 has only to be formed as deep as the trench-bottom electric field grading regions 13.

On the other hand, the gate electrodes 8 arranged in the cell region 30 need to be reliably electrically connected to the gate pad 21 through the gate contact holes 15. Thus, the corner of the open end of the outside trench 6a closer to the cell region 30 has a shape covered with the gate line leading portion 14.

However, when the corner of the open end of the outside trench 6a closer to the cell region 30 is covered with the gate fine leading portion 14 and a voltage is applied between the gate electrodes 8 and the source electrode 10, the reliability of the corner is prone to decrease by degradation or breakdown in the insulating film 22 due to concentration of an electric field on the corner owing to its shape and application of a high electric field to the insulating film 22 in the cell region 30.

With no adoption of Embodiment 1, the outside trench 6a is formed to pierce through the source regions 5 in the well region 4. In other words, the drift layer 3 that is in contact with the corner of the outside trench 6a closer to the cell region 30, that is, the second impurity region 25 becomes the n-type source region 5. The source regions 5 are normally formed to have low resistance to reduce the ON resistance in the semiconductor device. Thus, the resistance from the source electrode 10 to the corner of the open end of the outside trench 6a closer to the cell region 30 is lower, and most of the voltages applied between the source electrode 10 and the gate electrodes 8 are applied to the insulating film 22 that covers the corner of the open end of the outside trench 6a closer to the cell region 30 as they are. In other words, a high electric field is applied to the insulating film 22.

According to Embodiment 1, the drift layer 3 that is in contact with the corner of the outside trench 6a closer to the cell region 30, that is, the second impurity region 25 is of p-type. Thus, the voltage to be applied to the insulating film 22 that covers the corner of the open end of the outside trench 6a closer to the cell region 30 can be reduced in proportion to increase in a voltage drop caused by the parasitic resistance of the second impurity region 25 whose resistance is higher than that of the n-type second impurity region 25. Consequently, the reliability of the insulating film 22 can be increased.

The reason why the parasitic resistance increases when the second impurity region 25 is of p-type rather than n-type is because the carrier mobility of holes is lower than that of electrons and an energy level of acceptor impurities is often deeper than that of donor impurities.

Furthermore, the second impurity region 25 according to Embodiment 1 is the p-type well region 4. Since the concentration of the well region 4 is set lower than that of the source regions 5, the advantage of reduction in electric field to be applied to the insulating film 22 can be obtained even from the high resistance caused by the difference in impurity concentration.

Furthermore, the gate electrodes 8 embedded only in the gate trenches 6 in the cell region 30 by etching back to prevent an electric field from being concentrated on the gate insulating film 7 between the gate electrodes 8 and the source electrode 10 at the open ends of the gate trenches 6 in the cell region 30 according to Embodiment 1. In other words, placing the top surface of the gate electrodes 8 deeper than the surface of the source regions 5 and not covering, with the gate electrodes 8, the gate insulating film 7 at the corners of the open ends of the gate trenches 6 results in no application of the voltage between the gate electrodes 8 and the source electrode 10 to the gate insulating film 7 at the corners of the open ends of the gate trenches 6, whereby concentration of an electric field on the gate insulating film 7 can be prevented.

Although the electric field applied to the gate insulating film 7 is suppressed by forming the top surface of the gate electrodes 8 deeper than the open ends of the gate trenches 6 according to Embodiment 1, concentration of the electric field by shape may be graded, for example, by rounding the open ends of the gate trenches 6. However, rounding the open ends of the gate trenches 6 leads to increase in cell pitch of the unit cells 31*a* that is a cell size.

The structures other than those described herein can be appropriately omitted. Conversely, when an optional structure specified in Embodiment 1 is appropriately added, the advantages above can be produced.

Furthermore, although the surface of the silicon carbide semiconductor substrate 1 is defined as, for example, the (0001) plane having an off-angle θ that is inclined toward a [11-20] axial direction according to Embodiment 1, even when the surface is a (0001-1) plane having the off-angle θ that is inclined toward the [11-20] axial direction, a trench-gate MOSFET having the same structure can be manufactured and the advantages according to Embodiment 1 can be obtained. Obviously, the other planes including an (11-0) plane and a (03-38) plane may be used.

Furthermore, although the cell structure in Embodiment 1 is rectangular such as square in a plan view, it is not limited to such. The cell structure may be shaped in, for example, stripes, polygons, or waves.

FIG. 10 is a plan view schematically illustrating a structure of a trench-gate MOSFET having a cell structure shaped in stripes according to a modification of Embodiment 1. FIG. 11 is a cross-sectional view taken along A-A' of FIG. 10. FIG. 10 omits a part of the structure to facilitate understanding of the arrangement of the gate line leading portion 14. Furthermore, since the cross-sectional view taken along B-B' of FIG. 10 and the cross-sectional view taken along C-C' of FIG. 10 are identical to those in FIG. 3 and FIG. 4, respectively, they are not provided again.

FIG. 11 differs in structure from FIG. 2 in that the cell structure in the cell region 30 is shaped in stripes. The structural difference creates differences in shape of the well contact region 16, the source contact hole 17, and the interlayer insulation film 9.

Although describing the trench-gate MOSFET, Embodiment 1 is not limited to MOSFETs. For example, an IGBT obtained by removing the silicon carbide semiconductor substrate 1 and instead implanting p-type impurities on the back side of the drill layer 3 to form a backside impurity region or an IGBT manufactured by changing the silicon carbide semiconductor substrate 1 to p-type produces the same advantages as the MOSFETs. Here, the source regions 5 correspond to emitter regions of the IGBT, and the drain electrode 11 corresponds to a collector electrode of the IGBT.

Although Embodiment 1 describes a silicon carbide semiconductor device as a semiconductor device, the other semiconductor materials may be used. Examples of the other semiconductor materials include silicon (Si) and wide bandgap materials.

Examples of the wide bandgap materials include gallium nitride (GaN) and diamond as well as SiC.

The semiconductor devices containing the wide bandgap materials are highly expected to be used particularly at high temperatures and with application of high voltages. The advantages of adopting Embodiment 1 will increase because the reliability of insulating films is prone to decrease at high temperatures. Furthermore, Embodiment 1 is more advantageous to address increase in voltage to be applied to insulating films in the tendency to apply higher voltage.

The silicon carbide semiconductor devices are known as more frequent occurrence of an electron trap at a MOS interface between the insulating, film 22 and the drift layer 3 made of silicon carbide than semiconductor devices made of Si, and the reliability of the MOS interface and the insulating film 22 is lower than that of the semiconductor devices made of Si. Thus, the advantages of adopting Embodiment 1 are larger because the electric field to be applied to the insulating film 22 can be reduced.

It is assumed in Embodiment 1 that n-type impurities include nitrogen and phosphorus and p-type impurities include aluminum and boron.

Furthermore, the semiconductor device according to Embodiment 1 further includes the well contact regions 16 partially formed in the surface layer of the well region 4, and the well contact regions 16 are surrounded by the source regions 5 (first impurity regions) in a plan view and electrically connect the well region 4 to the source electrode 10 (first electrode). The advantages of Embodiment 1 can be obtained without the well contact regions 16.

Embodiment 2

Hereinafter, the same reference numerals will be assigned to the same structure described in Embodiment 1, and the detailed description thereof will be appropriately omitted.

Figure 12:
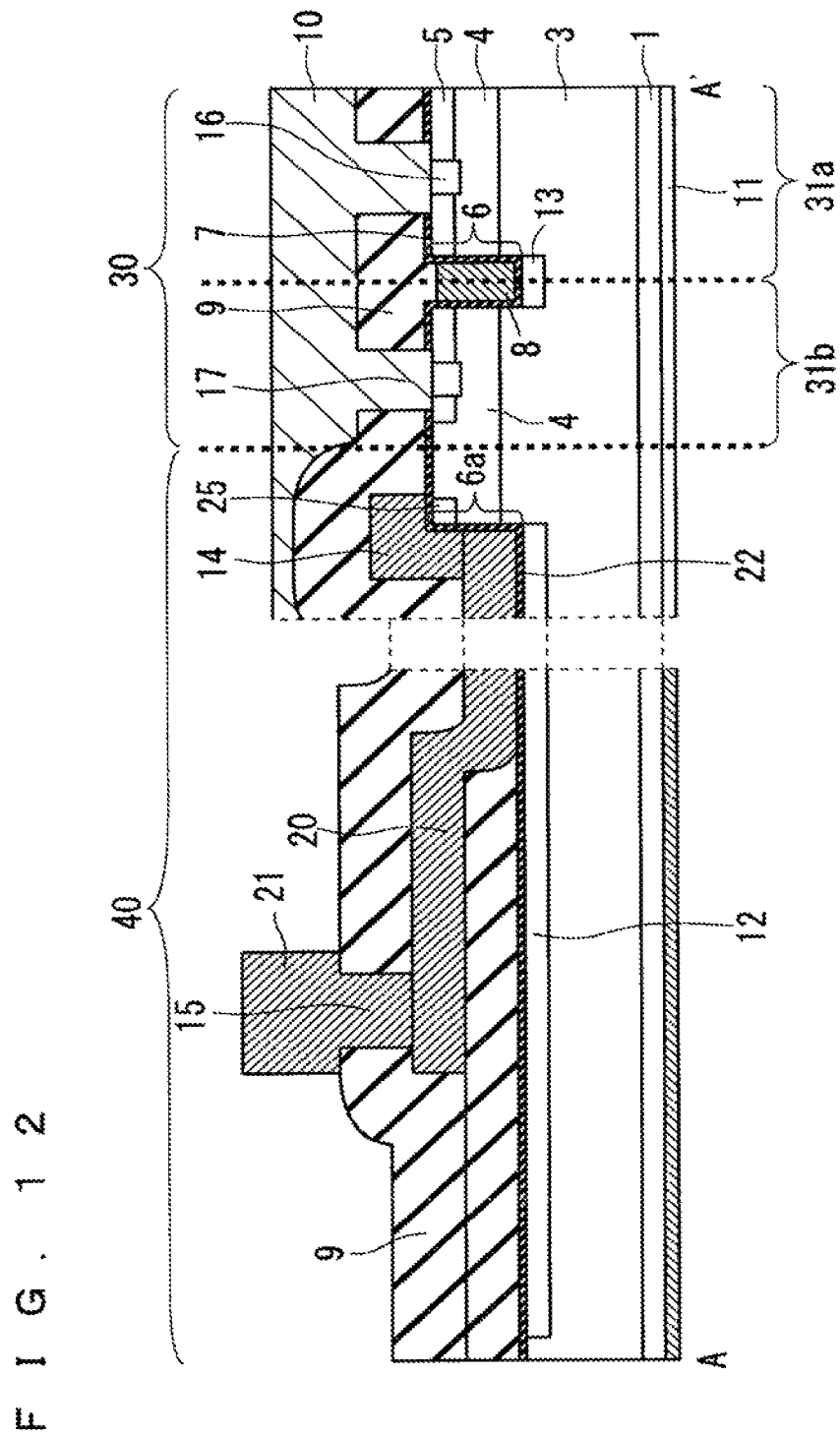
FIG. 12 is a cross-sectional view schematically illustrating a structure of a semiconductor device according to Embodiment 2.

The structure of a semiconductor device according to Embodiment 2 will be described. FIG. 12 is a cross-sectional view schematically illustrating a structure of a trench-gate MOSFET as the semiconductor device according to Embodiment 2. FIG. 12 is a drawing corresponding to FIG. 2 according to Embodiment 1. In Embodiment 2, the n-type described in Embodiment 1 is referred to as a first conductivity type, and the p-type described in Embodiment 1 is referred to as a second conductivity type. Conversely, the first conductivity type may be defined as p-type, and the second conductivity type may be defined as n-type. In other words, the n-type described in Embodiment 1 may he defined as p-type, and the p-type described in Embodiment 1 may be defined as n-type in Embodiment 2.

As illustrated in FIG. 12, an n-type region is formed as the second impurity region 25 at the corner of the open end of the outside trench 6*a* closer to the cell region 30 and in the surface layer of the drift layer 3 facing the gate line leading portion 14 through the insulating film 22.

The n-type second impurity region 25 is lower in impurity concentration than the source regions 5 in Embodiment 2. The impurity concentration in the second impurity region 25 may range, for example, from $5 \times 10^{-}$ [cm$^{-3}$] to $5 \times 10^{18}$ [cm$^{-3}$].

The second impurity region 25 that is a region of the first conductivity type and lower in impurity concentration than the source regions 5 is higher in res stance than the second impurity region 25 having the same impurity concentration as the source regions 5. Thus, the same advantages as those according to Embodiment 1 can be obtained.

In other words, when the second in region 25 is higher in resistance than the source regions 5, advantages of Embodiment 2 can be obtained.

Reduction in the impurity concentration of the second impurity region 25 enables increase in the resistance thereof. As the impurity concentration of the second impurity region 25 is lower the quality of the insulating film 22 on the second impurity region 25 becomes higher. Thus, increase in resistance of the second impurity region 25, that is, reduction in the impurity concentration thereof increases the quality of the insulating film 22, and further brings an advantage of increase in reliability of the insulating film 22.

The advantage of increase in reliability of the insulating film 22 that depends on the impurity concentration is particularly prominent in SiC that is known as being lower in reliability than Si on which the insulating film 22 is present. Furthermore, since the wide bandgap materials including SiC are more effective at increasing the quality of insulating films that highly require reliability, for example, at high temperatures and with application of high voltages.

Embodiment 2 describes the differences with Embodiment 1, and omits the description on the same or corresponding portions.

Embodiment 3

Hereinafter, the same reference numerals will be assigned to the same structure described in Embodiment 1 or 2, and the detailed description thereof will be appropriately omitted.

Although the description hereinafter assumes the first conductivity type as n-type and the second conductivity type as p-type, the respective conductivity types may be reversed.

Figure 14:
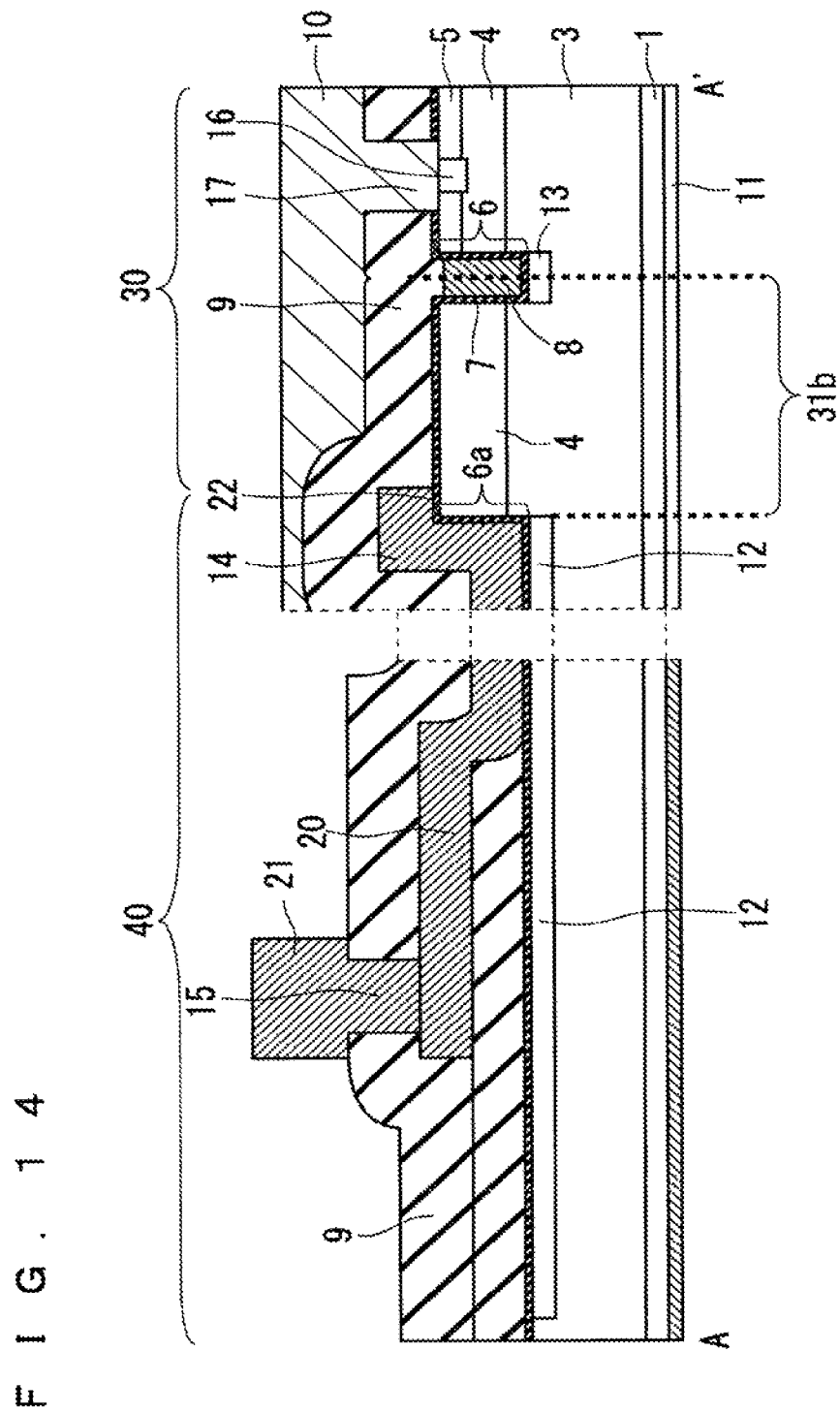
FIG. 14 is a cross-sectional view taken along A-A' of FIG. 13.
Figure 15:
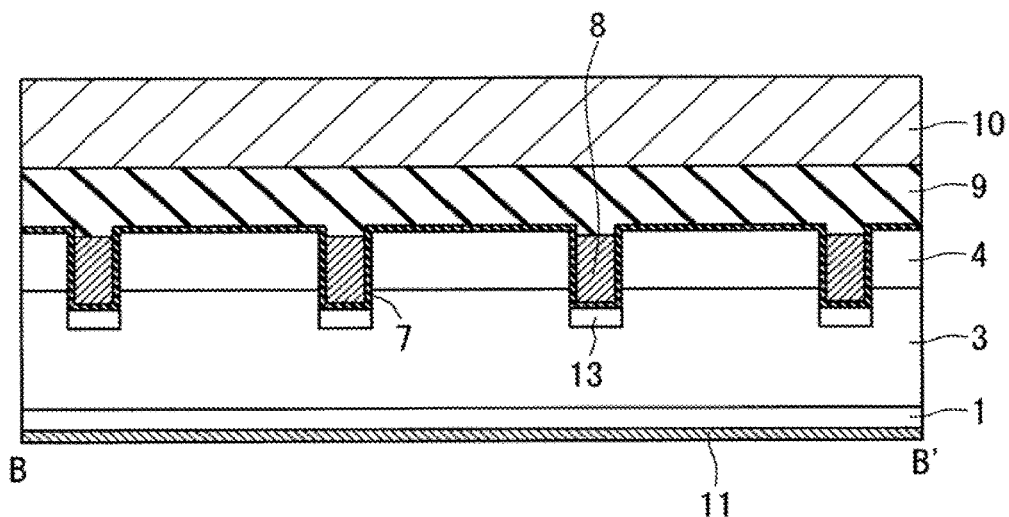
FIG. 15 is a cross-sectional view taken along B-B' of FIG. 13.

The structure of a semiconductor device according to Embodiment 3 will be described. FIG. 13 is a cross-sectional view schematically illustrating a structure of a trench-gate silicon carbide MOSFET as the semiconductor device according to Embodiment 3. Furthermore, FIG. 14 is a cross-sectional view taken along A-A' of FIG. 13, and FIG. 15 is a cross-sectional view taken along B-B' of FIG. 13. Since the cross-sectional view taken along C-C' of FIG. 13 is identical to that in FIG. 4, it is not provided again.

As illustrated in FIG. 14 according to Embodiment 3, the source region 5 is not formed at all in a region from the outermost circumferential cell 31b to the side surface of the outside trench 6a closer to the cell region 30, and the well region 4 is formed in the entire surface layer of the dull layer 3 in the same region. In other words, the entire surface layer of the drift layer 3 from the outermost circumferential cell 31b to the side surface of the outside trench 6a closer to the cell region 30 is of p-type. A cell pitch d1 of the outermost circumferential cells 31b is formed as long as a cell pitch of the unit cells 31a formed inner than the outermost circumferential cells 31b in the cell region 30. Although the source contact hole 17 is not formed in the outermost circumferential cell 31b in FIG. 14, it may be formed.

The advantages produced by Embodiment 3 will be exemplified hereinafter. Since the source region 5 is not formed in the outermost circumferential cell 31b of the trench-gate MOSFET according to Embodiment 3, there is no need to align the end of the gate line leading portion 14 closer to the cell region 30 and the end of the source region 5 in the cell region 30 closer to the outside.

Since the second impurity region 25 is higher in resistance than the source regions 5 to increase the resistance of the drift layer 3 at the corner of the open end of the outside trench 6a that is closer to the cell region 30 according to Embodiment 1 or 2, a high electric field is prone to be applied to a region of the gate line leading portion 14 that is extended off the cell region 30 from the open end of the outside trench 6a subject to the concentration of the electric field at the corner. Thus, when the end of the gate line leading portion 14 closer to the cell region 30 overlaps the end of the source region 5 in the cell region 30 closer to the outside in an element vertical direction through the insulating film 22, a leak current may increase in the insulating film 22 at the overlapping portion when a voltage is applied between the source electrode 10 and the gate line leading portion 14 that is electrically connected to the gate electrodes 8.

The second impurity region 25 according to Embodiment 3 is the surface layer of the drift layer 3 facing the insulating film 22 in a region of the gate line leading portion 14 from the corner of the open end of the outside trench 6a closer to the cell region 30 to the end of the cell region 30, and is lower in resistance than the source regions 5. In other words, since the surface layer of the drift layer 3 facing the gate line leading portion 14 through the insulating film 22 is higher in resistance than the source regions 5 as a result of the gate line leading portion 14 extending off the cell region 30 from the outside trench 6a, an advantage of reducing the leak current in the insulating film 22 caused by the overlapping of the gate line leading portion 14 and the source region 5 with application of a voltage between the source electrode 10 and the gate line leading portion 14 can be obtained.

Furthermore, since the source region 5 is not formed in the outermost circumferential cell 31b, even when the gate line leading portion 14 significantly extends off the cell region 30 above the drift layer 3, the gate line leading portion 14 never overlaps the source region 5. Thus, the reliability of the insulating film 22 will be increased. Furthermore, when the polysilicon 25 is etched, there is no need to align the mask for etching back and the source region 5, which will ease the processes.

The surface layer of the drift layer 3 in the outermost circumferential cell 31b and from the outermost circumferential cells 31b to the side surface of the outside trench 6a closer to the cell region 30 is of p-type according to Embodiment 3. Even when the surface layer of the drift layer 3 is of n-type, the advantages of Embodiment 3 can be obtained with the impurity concentration of the drift layer 3 lower than that of the source regions 5. For example, since in an accumulation type MOSFET in which a n-type channel region for accumulation channel is formed on the surface of the well region 4, the n-type channel region formed in the outermost circumferential cell 31b and from the outermost circumferential cell 3 1b to the side surface of the outside trench 6a closer to the cell region 30 is lower in resistance than the n-type source region 5, the advantages of Embodiment 3 can be obtained.

In other words, when the drift layer 3 is higher in resistance than the drill layer 3 in the case where the source region 5 formed in the unit cells 31a is formed in the outermost circumferential cell 31b, in the outermost circumferential cell 31b and from the outermost circumferential cell 31b to the side surface of the outside trench 6a closer to the cell region 30, the advantages of Embodiment 3 can be obtained. In other words, when the drift layer 3 below the gate line leading portion 14 closer to the cell region 30 with respect to the side surface of the outside trench 6a closer to the cell region 30 is formed above the drift layer 3 higher in resistance than the source region 5, the advantages of Embodiment 3 can be obtained.

Embodiment 3 describes the differences with Embodiment 1 or 2, and omits the description on the same or corresponding portions.

Embodiment 4

Figure 16:
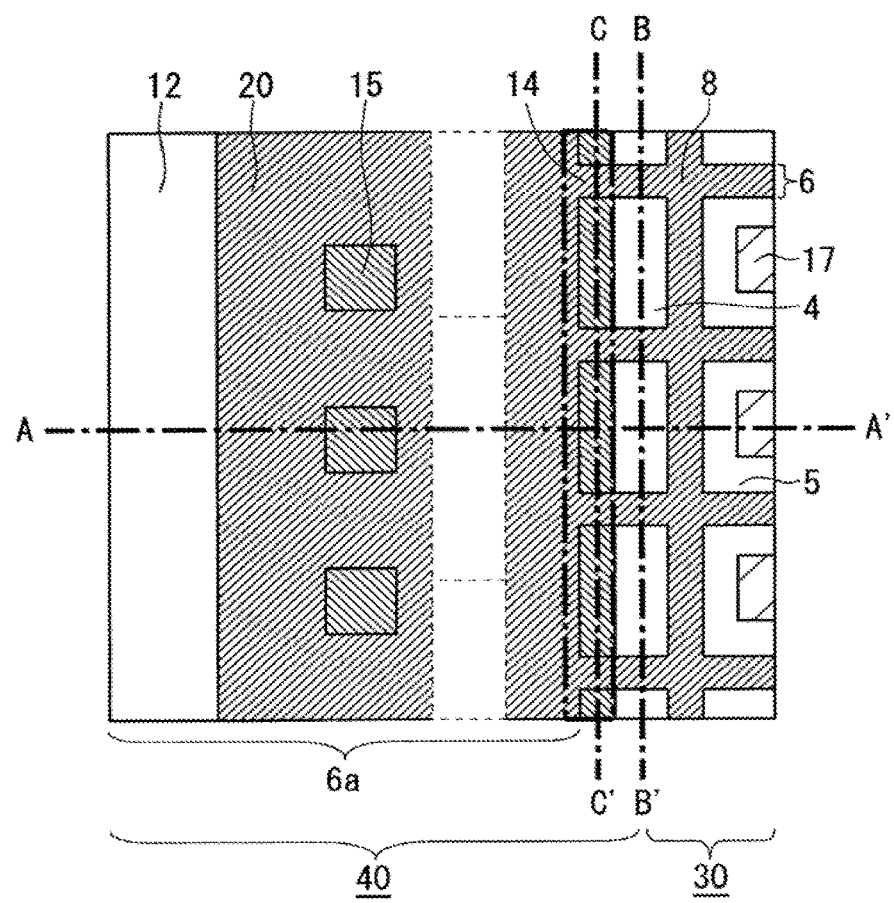
FIG. 16 is a plan view schematically illustrating a structure of a semiconductor device according to Embodiment 4.
Figure 17:
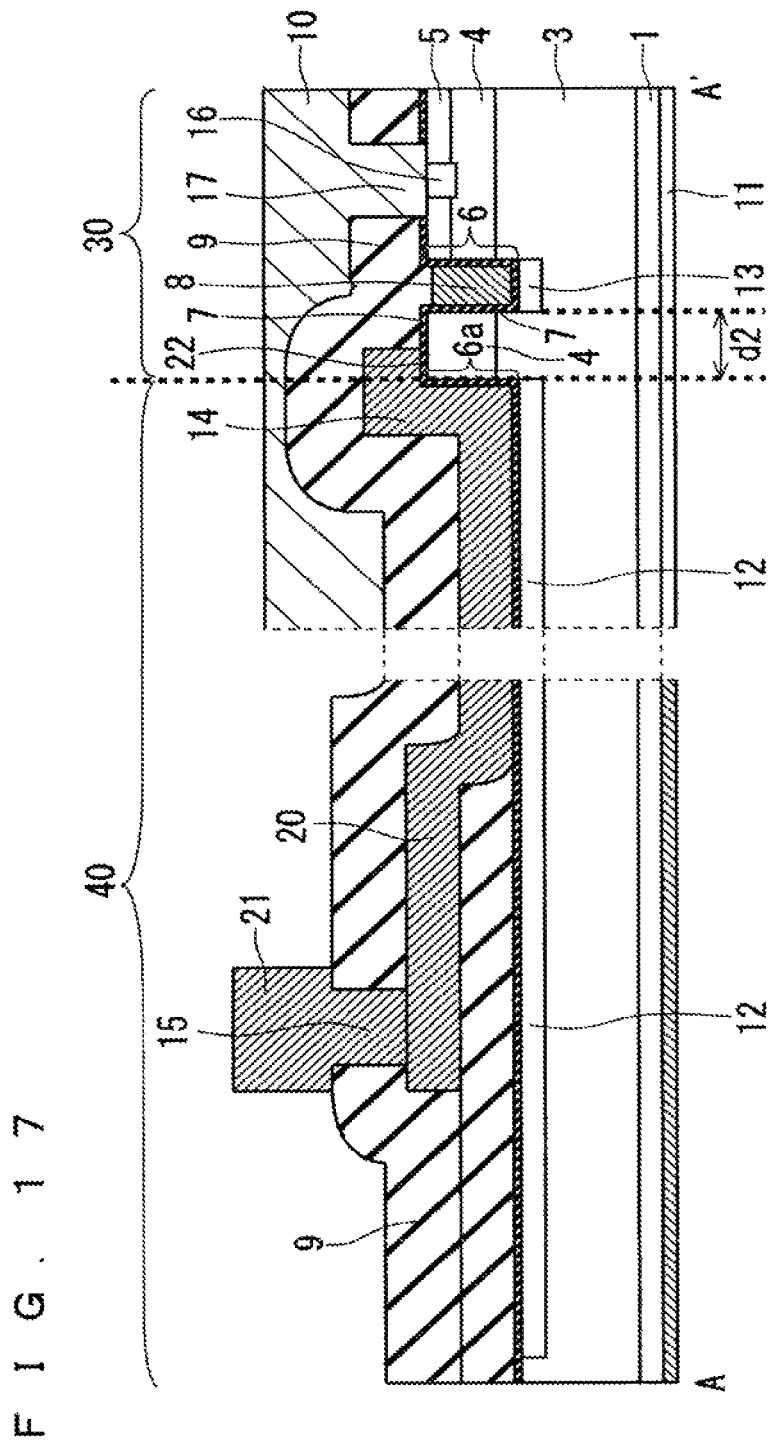
FIG. 17 is a cross-sectional view taken along A-A' of FIG. 16.

The structure of a semiconductor device according to Embodiment 4 will be described, FIG. 16 is a plan view schematically illustrating a structure of a trench-gate MOSFET as the semiconductor device according to Embodiment 4. Furthermore, FIG. 17 is a cross-sectional view taken along A-A' of FIG. 16. Since the cross-sectional view taken along B-B' of FIG. 16 and the cross-sectional view taken along C-C' of FIG. 16 are identical to those in FIG. 3 and FIG. 4, respectively, they are not provided again.

As illustrated in FIG. 17, the source region 5 is not formed and the surface layer of the drift layer 3 is the entirety of the well region 4 in the outermost circumferential cell 31b. Furthermore, the cell pitch of the outermost circumferential cells is set shorter than the cell pitch d1 of the unit cells 31a. In other words, a distance d2 between the side surface of the gate trench 6 in the outermost circumferential cell 31b and the side surface of the outside trench. 6a closer to the cell region 30 is shorter than the cell pitch d1 of the unit cells 31a.

Specifically, it might be better if the distance d2 ensures the extension amount for preventing disconnection in the gate line leading portion 14, and ranges, for example, from 0.3 μm to 5.0 μm, and more preferably from 0.5 μm to 1.5 μm.

Although the source contact hole 17 is not open in the outermost circumferential cell 31b in FIG. 17, it may be open.

The advantages produced by Embodiment 4 will be exemplified hereinafter. Since the source region 5 is not formed in the outermost circumferential cell 31b of the trench-gate MOSFET according to Embodiment 4 as Embodiment 3, the reliability can be increased because the gate line leading portion 14 and the source region 5 do not face through the insulating film 22 and the electric field to be applied to the insulating film 22 can be reduced. Furthermore, there is no need to align the end of the gate line leading portion 14 closer to the cell region 30 and the end of the source region 5 in the cell region 30 closer to the outside.

In addition, since the distance d2 can be made shorter than the cell pitch d1 of the unit cells 31a, an invalid region of the semiconductor device can be reduced. As a result, the ON resistance of the elements can be reduced.

Furthermore, the distance between the termination electric field grading region 12 formed directly under the outside trench 6a and the trench-bottom electric field grading region 13 formed directly under the gate trench 6 in the outermost circumferential cell 31b in the cell region 30 becomes shorter. Thus, when the MOSFET is turned OFF, extension of a depletion layer from the termination electric field grading region 12 and the trench-bottom electric field grading regions 13 to the drift layer 3 sufficiently depletes the vicinity of the border between the cell region 30 and the termination region 40, and increases a reduced surface electric field (RESURF) effect by which the electric field is graded. As a result, an advantage of increasing the element breakdown voltage when the MOSFET is turned OFF can be obtained.

Embodiment 4 describes the differences with Embodiment 1 or 2, and omits the description on the same or corresponding portions.

Although Embodiments described above in the Description specifies materials, dimensions, shapes, relative arrangement relationships, and conditions for implementation of each of the constituent elements, these are in all aspects illustrative and are not restrictive of Embodiments. Therefore, numerous modifications that have yet been exemplified will be devised without departing from the scope of Embodiments. Examples of the numerous modifications include a case where an optional constituent element is modified, added, or omitted, and further a case where at least one constituent element is extracted from at least one Embodiment and is combined with a constituent element in another Embodiment.

Furthermore, the constituent element described as one element in each of Embodiments above may be more than one unless it is contradictory. Furthermore, the constituent elements according to the present invention are conceptual units including one constituent element comprising structures and one constituent element corresponding to a part of a structure.

Furthermore, the Description is referenced to for all the objectives of the present invention, and is not regarded as prior art.

DESCRIPTION OF REFERENCE NUMERALS 1 silicon carbide semiconductor substrate, 3 drift layer, 4 well region, 5 source region, 6 gate trench, 6a outside trench, 7 gate insulating film, 8 gate electrode, 9 interlayer insulation film, 10 source electrode, 11 drain electrode, 12 termination electric field grading region, 13 trench-bottom electric field grading region, 14 gate line leading portion, 1 gate contact hole, 16 well contact region, 17 source contact hole, 18 resist mask, 19 etching mask, 20 gate line, 21 gate pad, 22 insulating film, 30 cell region, 31a unit cell, 31b outermost circumferential cell, 40 termination region.

The invention claimed is:
1. A semiconductor device, comprising:
a drift layer of a first conductivity type;
a well region of a second conductivity type that is formed in a surface layer of said drift layer in a cell region;
a first impurity region of said first conductivity type that is partially formed in a surface layer of said well region;
a first gate trench that pierces through said well region from a surface of said first impurity region to reach an inner part of said drift layer, the first gate trench being in an outermost circumferential cell of said cell region;
an outside trench formed outside said cell region and in said drift layer;
a gate electrode formed inside said first gate trench through a gate insulating film;
a gate line formed inside said outside trench through an insulating film; and
a gate line leading portion formed through said insulating film to cover a corner of an open end of said outside trench that is adjacent to said cell region, said gate line leading portion electrically connecting said gate electrode to said gate line,
wherein said first conductivity type is n-type, and said second conductivity type is p-type, said surface layer of said drift layer that is in contact with said corner has a second impurity region of said second conductivity type, said second impurity region is a part of said well region, and within a cross section normal to a side surface of the outside trench, a first distance in said cell region, from a first side surface of said first gate trench to the side surface of said outside trench adjacent to said cell region, is shorter than a second distance from a fourth side surface of a second gate trench to a fifth side surface of a third gate trench, the first side surface being closer to the outside trench than a second side surface of the first gate trench is to the outside trench, the second gate trench being closer to the outside trench than the third gate trench is to the outside trench and the second gate trench being a nearest such trench to the third gate trench, at least the third gate trench being included in a unit cell arranged inner to said outermost circumferential cell, wherein the first side surface and the side surface of the outside trench face to each other, and the fourth side surface and the fifth side surface face to each other.

2. The semiconductor device according to claim 1, wherein said second impurity region is a region included in said surface layer of said drift layer and facing said gate line leading portion through said insulating film from said corner to an end of said gate line leading portion that is adjacent to said cell region.

3. The semiconductor device according to claim 1, wherein an upper surface of said gate electrode is deeper than said surface of said first impurity region.

4. The semiconductor device according to claim 1, further comprising:
a substrate having a surface on which said drift layer is formed; and
a drain electrode formed on a back side of said substrate, wherein said first impurity region is a source region.

5. The semiconductor device according to claim 1, further comprising:
a substrate having a surface on which said drift layer is formed; and
a collector electrode formed on a back side of said substrate,
wherein said first impurity region is an emitter region.

6. The semiconductor device according to claim 1, wherein said drift layer is made of silicon carbide.

7. The semiconductor device according to claim 1, further comprising:
a first electric field grading region of said second conductivity type that is deeper than said well region.

8. The semiconductor device according to claim 7, wherein said first electric field grading region is formed under a bottom of said first gate trench.

9. The semiconductor device according to claim 7, further comprising:
a second electric field grading region of said second conductivity type that is formed at a bottom of said outside trench.

10. A semiconductor device, comprising:
a drift layer of a first conductivity type;
a well region of a second conductivity type that is formed in a surface layer of said drift layer in a cell region;
a first impurity region of said first conductivity type that is partially formed in a surface layer of said well region;
a first gate trench that pierces through said well region from a surface of said first impurity region to reach an inner part of said drift layer, the first gate trench being in an outermost circumferential cell of said cell region;
an outside trench formed outside said cell region and in said drift layer;
a gate electrode formed inside said first gate trench through a gate insulating film;
a gate line formed inside said outside trench through an insulating film; and
a gate line leading portion formed through said insulating film to cover a corner of an open end of said outside trench that is adjacent to said cell region, said gate line leading portion electrically connecting said gate electrode to said gate line, wherein said surface layer of said drift layer that is in contact with said corner has a second impurity region that is higher in resistance than said first impurity region, and within a cross section normal to a side surface of the outside trench, a first distance in said cell region, from a first side surface of said first gate trench to the side surface of said outside trench adjacent to said cell region, is shorter than a second distance from a fourth side surface of a second gate trench to a fifth side surface of a third gate trench, the first side surface being closer to the outside trench than a second side surface of the first gate trench is to the outside trench, the second gate trench being closer to the outside trench than the third gate trench is to the outside trench and the second gate trench being a nearest such trench to the third gate trench, at least the third gate trench being included in a unit cell arranged inner to said outermost circumferential cell, wherein the first side surface and the side surface of the outside trench face to each other, and the fourth side surface and the fifth side surface face to each other.

11. The semiconductor device according to claim 10, wherein said second impurity region is a region included in said surface layer of said drift layer and facing said gate line leading portion through said insulating film from said corner to an end of said gate line leading portion that is adjacent to said cell region.

12. The semiconductor device according to claim 10, wherein an upper surface of said gate electrode is deeper than said surface of said first impurity region.

13. The semiconductor device according to claim 10, further comprising:
a substrate having a surface on which said drift layer is formed; and
a drain electrode formed on a back side of said substrate, wherein said first impurity region is a source region.

14. The semiconductor device according to claim 10, further comprising:
a substrate having a surface on which said drift layer is formed; and
a collector electrode formed on a back side of said substrate,
wherein said first impurity region is an emitter region.

15. The semiconductor device according to claim 10, wherein said drift layer is made of silicon carbide.

16. The semiconductor device according to claim 10, further comprising:
a first electric field grading region of said second conductivity type that is deeper than said well region.

17. The semiconductor device according to claim 16, wherein said first electric field grading region is formed under a bottom of said first gate trench.

18. The semiconductor device according to claim 16, further comprising:
 a second electric field grading region of said second conductivity type that is formed at a bottom of said outside trench.

* * * * *